US012604391B2

(12) United States Patent
Bagung et al.

(10) Patent No.: US 12,604,391 B2
(45) Date of Patent: Apr. 14, 2026

(54) CIRCUIT BOARD FOR A POWER SEMICONDUCTOR MODULE, POWER SEMICONDUCTOR MODULE, AND METHOD FOR PRODUCING A CIRCUIT BOARD AND A POWER SEMICONDUCTOR MODULE

(71) Applicant: VITESCO TECHNOLOGIES GMBH, Regensburg (DE)

(72) Inventors: Detlev Bagung, Munich (DE); Christina Quest-Matt, Munich (DE); Holger Baldreich, Nuremberg (DE)

(73) Assignee: VITESCO TECHNOLOGIES GMBH, Regensburg (DE)

( * ) Notice: Subject to any disclaimer, the term of this patent is extended or adjusted under 35 U.S.C. 154(b) by 172 days.

(21) Appl. No.: 18/565,359

(22) PCT Filed: Jun. 8, 2022

(86) PCT No.: PCT/EP2022/065483
§ 371 (c)(1),
(2) Date: Nov. 29, 2023

(87) PCT Pub. No.: WO2022/258656
PCT Pub. Date: Dec. 15, 2022

(65) Prior Publication Data
US 2024/0260168 A1 Aug. 1, 2024

(30) Foreign Application Priority Data
Jun. 8, 2021 (DE) .................... 10 2021 114 658.5

(51) Int. Cl.
| | |
|---|---|
| *H05K 1/02* | (2006.01) |
| *H05K 3/00* | (2006.01) |
| *H05K 3/341* | (2026.01) |

(52) U.S. Cl.
CPC ......... *H05K 1/0206* (2013.01); *H05K 3/0094* (2013.01); *H05K 3/341* (2013.01);
(Continued)

(58) Field of Classification Search
CPC .......................... H05K 1/0206; H05K 3/0094
(Continued)

(56) References Cited

U.S. PATENT DOCUMENTS

| | | | |
|---|---|---|---|
| 5,848,466 A | 12/1998 | Viza et al. |
| 2002/0050380 A1 | 5/2002 | Tanimura et al. |

(Continued)

FOREIGN PATENT DOCUMENTS

| | | |
|---|---|---|
| DE | 42 26 168 A1 | 2/1994 |
| DE | 296 23 190 U1 | 12/1997 |

(Continued)

OTHER PUBLICATIONS

EPO (Rijswijk, NL), English version of the International Search Report, Form PCT/ISA/210, for International Application PCT/EP2022/065483, Oct. 5, 2022 (2 pp.).

*Primary Examiner* — Andargie M Aychillhum
(74) *Attorney, Agent, or Firm* — Pauley Erickson & Swanson

(57) ABSTRACT

A circuit board for a power semiconductor module, having at least one top side and one bottom side, wherein at least one mounting area for a power semiconductor component is provided on the top side, wherein on the mounting area, at least one solder layer is provided for connecting at least one power semiconductor component to the mounting area, which layer is divided into regions that are separated from one another by intermediate spaces, and wherein multiple thermal vias are provided in the circuit board and extend from the top side to the bottom side of the circuit board in the region of or near the mounting area, wherein each upper
(Continued)

opening of the thermal vias is directly surrounded by a respective region of the solder layer and each lower opening of the vias is covered by a layer of electrically insulating material.

18 Claims, 3 Drawing Sheets

(52) U.S. Cl.
CPC .............. *H05K 2201/09545* (2013.01); *H05K 2201/09572* (2013.01); *H05K 2201/09609* (2013.01)

(58) Field of Classification Search
USPC ........................................................ 174/252
See application file for complete search history.

(56) References Cited

U.S. PATENT DOCUMENTS

| | | | |
|---|---|---|---|
| 2007/0040255 A1* | 2/2007 | Osone ..................... | H01L 24/32 |
| | | | 257/E21.511 |
| 2015/0373848 A1* | 12/2015 | Seok ...................... | H01C 13/02 |
| | | | 361/767 |

FOREIGN PATENT DOCUMENTS

| | | | |
|---|---|---|---|
| DE | 198 42 129 590 | A1 | 4/2000 |
| DE | 199 09 505 | A1 | 9/2000 |
| DE | 103 35 129 | B3 | 6/2005 |
| EP | 3 038 436 | A1 | 6/2016 |
| JP | 2017-152459 | A | 8/2017 |
| WO | WO 2019/071283 | A1 | 4/2019 |

* cited by examiner

CIRCUIT BOARD FOR A POWER SEMICONDUCTOR MODULE, POWER SEMICONDUCTOR MODULE, AND METHOD FOR PRODUCING A CIRCUIT BOARD AND A POWER SEMICONDUCTOR MODULE

CROSS REFERENCE TO RELATED APPLICATION

This application is a National Phase filing in the United States, under 35 USC § 371, of PCT International Patent Application PCT/EP2022/065483, filed on 8 Jun. 2022 which claims the priority of German Patent Application No. DE 10 2021 114 658.5, filed on 8 Jun. 2021.

The above-referenced applications are hereby incorporated by reference herein in their entirety and are made a part hereof, including but not limited to those portions which specifically appear hereinafter.

BACKGROUND OF THE INVENTION

Field of the Invention

This invention relates to a circuit board for a power semiconductor module and to a power semiconductor module, and also relates to a method for producing such a circuit board and a power semiconductor module.

Discussion of Related Art

In power electronic components, it is common practice for the power semiconductor components and the circuit boards on which they are mounted in order to form power semiconductor modules to be embodied so that the lost heat generated during operation can be dissipated as effectively as possible.

In the region in which a power semiconductor component is mounted, referred to in the following as the mounting region, bores are sometimes provided, which pass all the way through the circuit board and typically are completely or partially filled with metal. The purpose of such bores, which are referred to as "thermal vias", is not to establish electrical connections between metallization layers, but rather to improve heat conduction through the circuit board. For this reason, they are typically electrically insulated from conductor track structures.

Because an electrical and mechanical connection of the power semiconductor component to the circuit board is to be produced in the mounting region, solder deposits are also provided in the mounting region.

For installation, the power semiconductor component is placed onto the circuit board in the mounting region and is connected to the circuit board by the solder deposits in a reflow process. Solder resist applied around the openings of the vias prevents solder from penetrating into the vias during the reflow process, which could lead to short circuits on the bottom side of the circuit board.

Due to the increasingly stringent requirements placed on the heat dissipation of power modules, for example, for use in the electromobility sector, there is one need to further improve the heat dissipation of power semiconductor modules.

SUMMARY OF THE INVENTION

Thus, one object of this present invention is to provide a circuit board for a power semiconductor module, which enables a particularly effective heat dissipation of the power semiconductor module while at the same time ensuring a reliable and long-term stable electrical and mechanical connection between at least one power semiconductor component and the circuit board. Another object is to disclose a method for producing such a circuit board.

This object and other objects are achieved by the subject matter described in this specification, in the independent claims, and in the dependent claims.

According to one embodiment of this invention, a circuit board for a power semiconductor module is disclosed, having at least one top side and one bottom side, wherein at least one mounting area for a power semiconductor component is provided on the top side. At least one solder layer, which is provided for connecting at least one power semiconductor component to the mounting area, is positioned on the mounting area, which solder layer is divided into regions that are separated from one another by intermediate spaces.

In this case, the mounting area is used for electrically and mechanically connecting the power semiconductor component to the circuit board and refers to the area on the top side of the circuit board, which corresponds essentially to the size of the power semiconductor component that is to be mounted and on which the electrical and mechanical connection is produced.

The solder layer is divided into regions that are separated from one another by intermediate spaces. Here and in the following, this is understood to mean that the solder layer is not applied as a continuous layer, but instead consists of or comprises individual regions that are separated from one another by intermediate spaces, such as regions that are kept free of the solder layer.

In the circuit board, multiple thermal vias are provided that extend from the top side to the bottom side of the circuit board in the region of or near the mounting area, wherein each upper opening of the thermal vias is directly surrounded by a respective region of the solder layer and each lower opening of the vias is covered by a layer of electrically insulating material.

In this connection, the upper opening of the thermal vias refers to the exposed opening on the top side of the circuit board and the lower opening refers to the exposed opening of the vias on the bottom side of the circuit board. The vias can have a metallization, such as at least their walls are fully or partly covered with a metallic layer in order to improve thermal conductivity.

According to one embodiment, only the walls of the vias are metallized so that the vias each have a central through hole. In an alternative embodiment, the vias are completely filled with metal. It is also possible for the vias to at first have no metallization and instead for the metallization to only be introduced during the soldering of a power semiconductor component onto the mounting area in such a way that liquefied solder flows through the upper opening into the vias.

The circuit board has one advantage that it enables a particularly good heat dissipation of a power semiconductor component that is mounted on the mounting area. By positioning the vias not just in separate regions of the mounting area that are kept free of the solder layer for this purpose, but also in regions that have the solder layer for electrically and mechanically connecting the power semiconductor component to the circuit board, it is possible to provide a very large number of vias in order to achieve a particularly effective heat dissipation on the mounting area and at the same time, a reliable and uniform solder bonding of the power semiconductor component.

It is no longer necessary to provide particular regions of the mounting area for the positioning of the vias and other regions that are separate from them for the solder connections and instead, vias and solder regions can be distributed over the entire mounting area. This enables a more uniform distribution of both functions, heat dissipation one the one hand and electrical and mechanical connection on the other, over the area and makes it possible to provide a greater overall number of vias and a larger quantity of solder.

Unlike the ones previously provided in the prior art, the upper openings of the thermal vias are not surrounded by a layer of solder stop mask in order to prevent a penetration of solder into the vias during the reflow process. Instead, the penetration of solder is not disadvantageous and can even be desirable because it contributes to a particularly good thermal conduction. Short circuits on the bottom side of the circuit board are prevented by the fact that the lower openings of the vias are covered by a layer of electrically insulating material, in particular a solder stop mask.

It is thus possible to surround the upper openings of the thermal vias directly with solder. During the soldering process, the upper openings of the vias prevent solder from being distributed unevenly over the mounting area. Through the positioning of the vias in the mounting area, it is possible to achieve a particularly uniform distribution of the solder and thus a particularly uniform bonding of the power semiconductor component.

Providing intermediate spaces between regions of the solder layer has the advantage that during the soldering process, flux and solvent can escape through the intermediate spaces. During the soldering process, the intermediate spaces can be completely or partially closed by flowing solder.

According to one embodiment, the regions of the solder layer that are separated from one another by the intermediate spaces are arranged in a geometric grid. For example, the regions of the solder layer can be embodied as square or rectangular regions and the intermediate spaces between the regions can be embodied as narrow, straight passageways.

Typically, the vias can also be arranged in a geometric grid that can, for example, correspond to the grid of the regions of the solder layer.

According to one embodiment, at least one thermal via is provided for each region of the solder layer. This is particularly advantageous because the at least one via can then perform for this region the task of keeping the solder material in place during the soldering process. It is also possible for multiple thermal vias to be provided in each region of or near the solder layer.

According to one embodiment, the layer made of insulating material is embodied as a continuous layer on the bottom side of the circuit board.

According to this invention, a "continuous layer" is understood to mean that the layer has no intermediate spaces. A continuous layer of this kind can be applied particularly easily. The electrically insulating layer can cover the entire bottom side of the circuit board. It can also be applied, however, only in the region of or near the bottom side opposite from the mounting area in which the lower openings of the vias are located, which are to be covered by the electrically insulating layer.

According to one embodiment, the layer of insulating material is embodied as a solder stop mask layer. Such a layer is easy to apply and fulfills the purpose of the electrical insulation.

According to one embodiment, metallizations are provided in the circuit board beneath the mounting area in order to improve the thermal conductivity. The metallizations can, for example, be metal layers, which are the same size, at least laterally, as the mounting area and produce a thermal conduction in the direction toward the bottom side as well as a lateral heat dispersion. A "positioning of the metallizations underneath the mounting area" is understood to be a positioning between the mounting area and the region of or near the bottom side of the circuit board opposite from the mounting area.

Metallizations of this kind are known and improve the heat dissipation of the power semiconductor module.

The circuit board can, in particular, be embodied as a PCB. It is also possible, though, to use other technologies in which metallic layers are embedded in an electrically insulating matrix.

According to one embodiment of this invention, a power semiconductor module is disclosed that has at least one power semiconductor component, which is positioned on a mounting area of the above-described circuit board.

According to one embodiment, the thermal vias are at least partially filled with solder. This is solder that has flowed from the solder layer into the vias as the power semiconductor component is being soldered in place.

According to another embodiment of this invention, a method for producing a circuit board for a power semiconductor module is disclosed, which includes preparing a circuit board having at least one top side and one bottom side, wherein on the top side, at least one mounting area for a power semiconductor component is provided, wherein the circuit board has thermal vias, which extend from the top side to the bottom side of the circuit board in the region of or near the mounting area. The method also includes applying a solder layer, which is divided into regions that are separated from one another by intermediate spaces, onto the mounting area in such a way that upper openings of the thermal vias are each directly surrounded by a region of the solder layer. The solder layer can in particular be printed onto the top side of the circuit board.

The method also includes applying a layer of insulating material onto the bottom side of the circuit board so that at least the lower openings of the vias are covered by the layer of insulating material.

The method has the advantages already described in connection with the circuit board.

According to another embodiment of this invention, in addition to the step of providing a circuit board as already described above, a method for producing a power semiconductor module also includes mounting at least one power semiconductor component on the mounting area by a soldering process.

According to one embodiment, during the soldering process, solder travels from the solder layer at least partially into the thermal vias.

BRIEF DESCRIPTION OF THE DRAWINGS

Embodiments of this invention are described by way of example below based on schematic drawings, wherein.

DETAILED DESCRIPTION OF THE INVENTION

Figure 1:
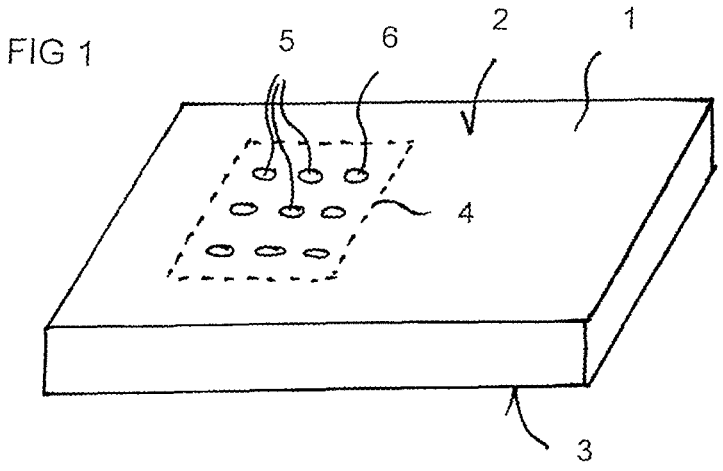
FIG. 1 shows a perspective view of a circuit board for a power semiconductor module during a method for producing a circuit board according to one embodiment of this invention.

FIG. 1 shows a circuit board 1 for a power semiconductor module, which has a top side 2 and opposite from this, a bottom side 3. The circuit board 1 can, for example, be a PCB.

On the top side 2, a mounting area 4 is provided as a subregion of the top side 2. The mounting area 4, which is indicated by the dashed line, refers to the area on which a power semiconductor component is to be mounted in order to form a power semiconductor module. Because large quantities of lost heat accumulate during the operation of the power semiconductor module, a heat dissipation of the circuit board 1 in the region of or near the mounting area 4 is important.

In the region of or near the mounting area 4, multiple vias 5 in the circuit board 1 are provided, which pass through the circuit board 1 from the top side 2 to the bottom side 3. The vias 5 are provided in the form of through bores in the circuit board 1 and for the sake of better thermal conduction, have metallizations, in particular a coating of their inner walls with metal. The vias 5 have upper openings 6, which are exposed on the top side 2 of the circuit board 1, and lower openings, which are not shown in FIG. 1.

In the embodiment shown, a total of nine thermal vias 5 are provided and are arranged in a geometrical grid.

Figure 2:
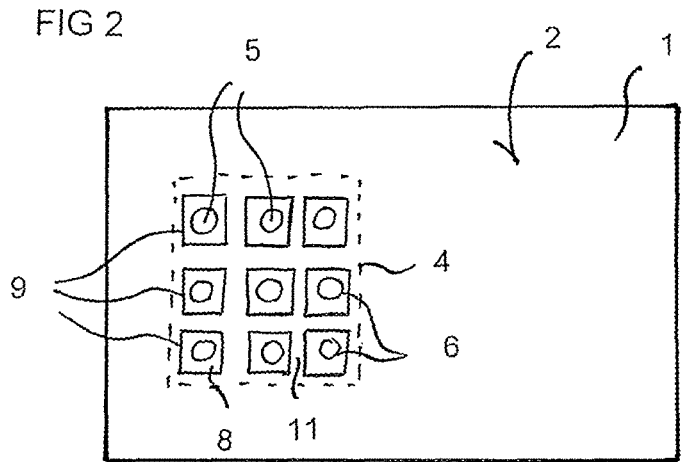
FIG. 2 shows a plan view of the top side of the circuit board according to FIG. 1 after a solder layer has been applied.

FIG. 2 shows a plan view of the circuit board 1 according to FIG. 1 after another method step for producing the circuit board 1. In this method step, a solder layer 8 is applied, for example, printed, onto the top side 2, at least in the region of or near the mounting area 4. The solder layer 8 is applied in the form of separate regions 9, wherein the regions 9 are separated from one another by means of intermediate spaces 11, which are kept free of the solder layer 8.

Each of the regions 9, which are embodied as rectangular in the embodiment shown, directly surrounds an upper opening 6 of one via 5, such as no barrier made of solder stop mask is positioned around the edge of the upper openings 6. In the embodiment shown, exactly one via 5 is provided in each region 9 of the solder layer.

Figure 3:
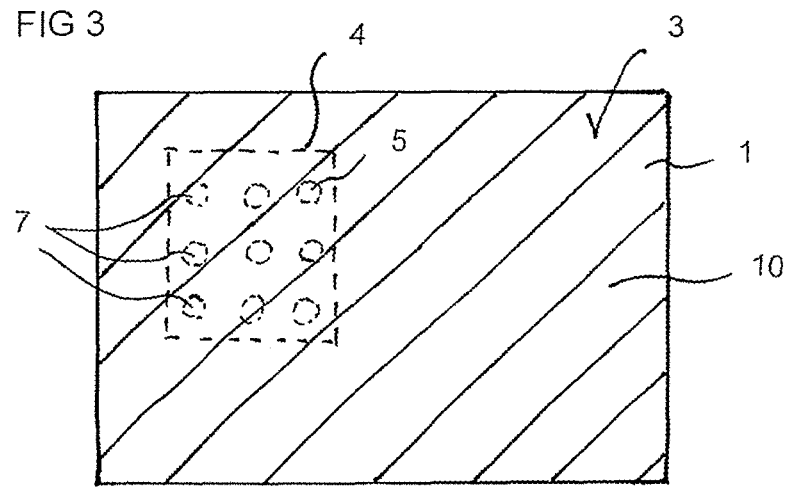
FIG. 3 shows a plan view of the bottom side of the circuit board according to FIGS. 1 and 2 after an insulating layer has been applied.

FIG. 3 shows a plan view of the bottom side 3 of the circuit board 1 according to FIG. 1 after an electrically insulating layer 10 has been applied to the bottom side 3 of the circuit board 1. In the embodiment shown, the insulating layer 10 is applied in the form of a continuous layer, which extends across the entire bottom side 3 of the circuit board 1 and covers the lower openings 7 of the vias 5. The insulating layer 10 thus insulates the metallized vias 5 from one another, even if during a soldering process, solder flows into the vias 5 and comes out again on the bottom side 3 of the circuit board 1.

In the embodiment shown, the insulating layer 10 on the bottom side 3 of the circuit board 1 is comprised of solder stop mask.

Figure 4:
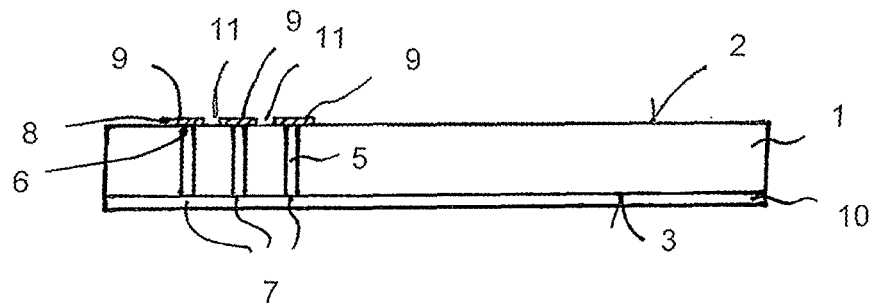
FIG. 4 shows a cutaway view of the circuit board according to FIGS. 2 and 3.

FIG. 4 shows a cutaway view of the circuit board 1 according to FIGS. 2 and 3. A metallization of the vias 5 is not shown in the figure for the sake of clarity.

Figure 5:
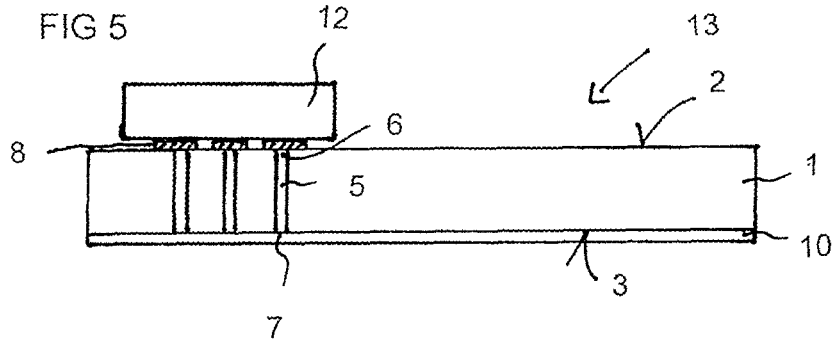
FIG. 5 shows a cutaway view of a power semiconductor module after a power semiconductor component has been mounted on a circuit board according to FIG. 4.

FIG. 5 shows a cutaway view of the circuit board 1 according to FIGS. 1 to 4 after another step in a method for producing a power semiconductor module. In this step, at least one power semiconductor component 12 is mounted onto the top side 2 of the circuit board 1, specifically onto the mounting area 4 provided for this purpose. In this case, contact lands of the power semiconductor component 12 that are not shown are brought into contact with the regions 9 of the solder layer 8.

To form a power semiconductor module 13, additional power semiconductor components or other components can also be mounted on the circuit board 1, but these are not shown in the figures.

Figure 6:
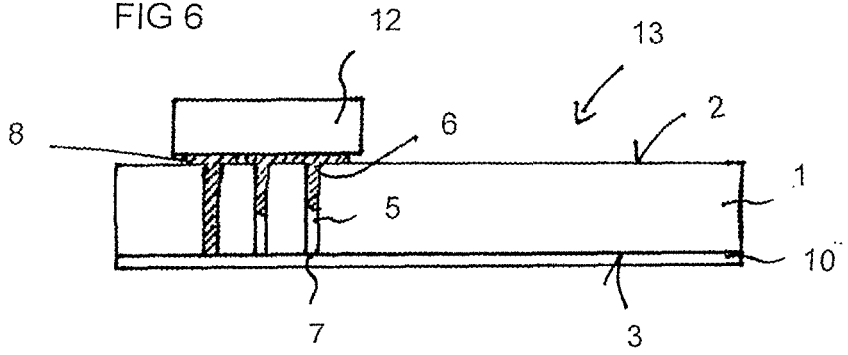
FIG. 6 shows a cutaway view of the power semiconductor module according to FIG. 5 after a reflow process.

FIG. 6 shows the power semiconductor module 13 according to FIG. 5 after a reflow process. As shown in the cutaway view, solder that has liquefied during the soldering process has partially flowed from the solder layer 8 into the vias 5. In addition, the intermediate spaces 11 between regions of the solder layer 8 have partially closed. During the soldering, flux and solvent can escape from the solder layer 8 through the intermediate spaces 11 and the individual regions 9 of the solder layer 8 can partially or completely flow into one another.

The exposed upper openings 6 of the vias 5 on the top side 2 of the circuit board 1, which in the embodiment shown are each surrounded by a region of the solder layer 8, prevent the solder of the solder layer 8 from being distributed unevenly over the mounting area 4. After the soldering process, the power semiconductor component 12 is thus connected to the circuit board 1 at the same time and the circuit board 1 has effective thermally conducting structures underneath the mounting area 4 with the vias 5 that are completely or partially filled with metal.

Figure 7:
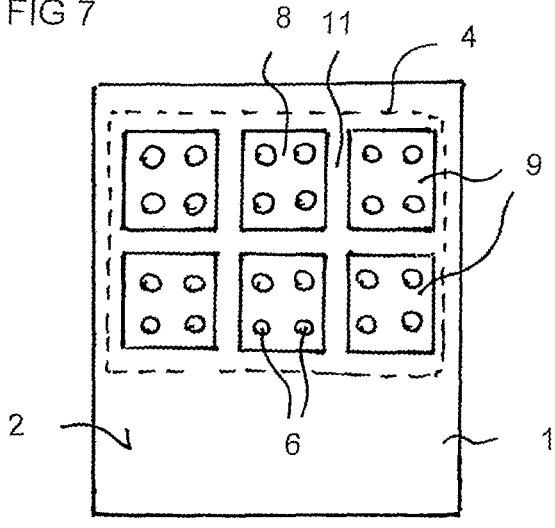
FIG. 7 shows a plan view of a circuit board according to an alternative embodiment.

FIG. 7 shows another embodiment of the circuit board 1 in which there are four exposed openings 6 of the vias 5 in each region 9 of the solder layer 8. A uniform distribution of solder on the mounting area 4 is assured in this embodiment as well.

Figure 8:
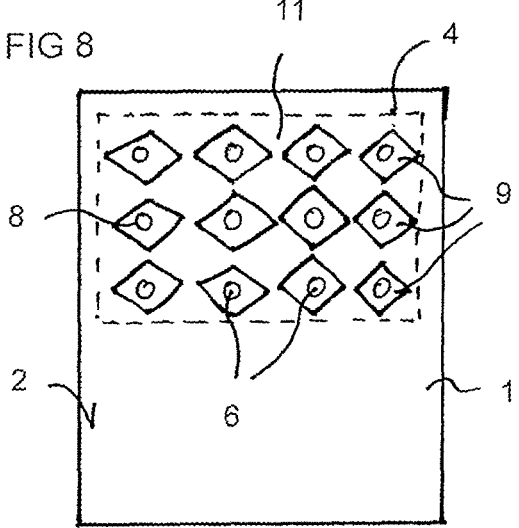
FIG. 8 shows a plan view of a circuit board according to another alternative embodiment.

FIG. 8 shows another embodiment of the circuit board 1, which differs from the one shown in FIG. 2 because the individual regions 9 of the solder layer 8 are embodied as rhomboid and are arranged in a grid. Alternatively, other shapes for the regions 9 are also possible, for example, round shapes and/or combinations of the embodiments shown in FIGS. 2, 7, and 8.

While in the foregoing specification this invention has been described in relation to certain preferred embodiments, and many details are set forth for purpose of illustration, it will be apparent to those skilled in the art that this invention is susceptible to additional embodiments and that certain of the details described in this specification and in the claims can be varied considerably without departing from the basic principles of this invention.

The invention claimed is:

1. A circuit board for a power semiconductor module, having at least one top side and one bottom side, wherein at least one mounting area for a power semiconductor component is provided on the top side, wherein the mounting area includes at least one solder layer for connecting at least one power semiconductor component to the mounting area, wherein the at least one solder layer is divided into regions that are separated from one another by intermediate spaces, and wherein multiple thermal vias are provided in the circuit board and extend from the top side to the bottom side of the circuit board in the region of the mounting area, wherein each upper opening of the thermal vias is directly surrounded by a respective region of the solder layer and each lower opening of the thermal vias is covered by a layer of electrically insulating material.

2. The circuit board according to claim 1, wherein the regions of the solder layer that are separated from one another by the intermediate spaces are arranged in a geometrical grid.

3. The circuit board according to claim 2, wherein at least one thermal via is provided for each region of the solder layer.

4. The circuit board according to claim 3, wherein the layer of electrically insulating material is embodied as a continuous layer on the bottom side of the circuit board.

5. The circuit board according to claim 4, wherein the layer of insulating material is embodied as a solder stop mask layer.

6. The circuit board according to claim 5, wherein metallizations are provided beneath the mounting area in the circuit board in order to improve the thermal conductivity.

7. A circuit board according to claim 6, which is embodied as a PCB.

8. The circuit board of claim 7, wherein a power semiconductor module having at least one power semiconductor component is positioned on a mounting area of a circuit board.

9. The circuit board according to claim 8, wherein the thermal vias are at least partially filled with solder.

10. The circuit board according to claim 1, wherein at least one thermal via is provided for each region of the solder layer.

11. The circuit board according to claim 1, wherein the layer of electrically insulating material is embodied as a continuous layer on the bottom side of the circuit board.

12. The circuit board according to claim 1, wherein the layer of insulating material is embodied as a solder stop mask layer.

13. The circuit board according to claim 1, wherein metallizations are provided beneath the mounting area in the circuit board in order to improve the thermal conductivity.

14. A circuit board according to claim 1, which is embodied as a PCB.

15. The circuit board according to claim 1, wherein the intermediate spaces are kept free of solder.

16. A method for producing a circuit board for a power semiconductor module, including the steps of:

preparing a circuit board having at least one top side and one bottom side, wherein on the top side, there is at least one mounting area for a power semiconductor component, wherein the circuit board has thermal vias, which extend from the top side to the bottom side of the circuit board in the region of the mounting area;

applying a solder layer, which is divided into solder regions that are separated from one another by solder-free intermediate spaces, onto the mounting area so that upper openings of the thermal vias are each directly surrounded by a region of the solder layer; and applying a layer of insulating material onto the bottom side of the circuit board so that at least the lower openings of the thermal vias are covered by the layer of insulating material.

17. A method for producing a power semiconductor module, including the steps of:

preparing a circuit board according to claim 10; and mounting at least one power semiconductor component on the mounting area by a soldering process.

18. The method according to the claim 17, wherein during the soldering process, solder travels from the solder layer at least partially into the thermal vias.

* * * * *